United States Patent [19]
Gardner et al.

[11] Patent Number: 6,127,235
[45] Date of Patent: Oct. 3, 2000

[54] METHOD FOR MAKING ASYMMETRICAL GATE OXIDE THICKNESS IN CHANNEL MOSFET REGION

[75] Inventors: Mark I. Gardner, Cedar Creek; H. James Fulford; Charles E. May, both of Austin, all of Tex.

[73] Assignee: Advanced Micro Devices, Sunnyvale, Calif.

[21] Appl. No.: 09/002,656

[22] Filed: Jan. 5, 1998

[51] Int. Cl.⁷ .................................................. H01L 21/336
[52] U.S. Cl. ............................................................. 438/305
[58] Field of Search .................................... 438/304, 303, 438/197, 142; 257/344, 408

[56] References Cited

U.S. PATENT DOCUMENTS

| | | |
|---|---|---|
| 5,302,845 | 4/1994 | Kumagai et al. . |
| 5,841,168 | 11/1998 | Gardner et al. ......................... 257/344 |
| 5,952,702 | 9/1999 | Gardner et al. ......................... 257/408 |

FOREIGN PATENT DOCUMENTS

| | | |
|---|---|---|
| 07772659 | 4/1997 | European Pat. Off. . |
| 06151833 | 5/1994 | Japan . |

OTHER PUBLICATIONS

Stephen A. Campbell et al., "MOSFET Transistors Fabricated with High Permitivity TiO$_2$ Dielectrics," IEEE Transactions on Electron Devices, vol. 44, No. 1, Jan. 1997.

*Primary Examiner*—Charles Bowers
*Assistant Examiner*—Craig Thompson

[57] ABSTRACT

A semiconductor device has gate with a first material having a first dielectric constant adjacent the semiconductor substrate and a second material having a second dielectric constant adjacent the semiconductor substrate. A conductor, such as polysilicon, is then placed on the gate so that the first and second materials are sandwiched between the conductor and the semiconductor substrate. Since the dielectric constants of the two materials are different, the gate acts like a gate having a single dielectric with at least two thicknesses. One dielectric constant is larger than the other dielectric constant. The higher dielectric constant material is comprised of a single spacer located within the gate at the sidewall nearest the drain of the semiconductor device. A layer of silicon dioxide is positioned on the semiconductor substrate between the spacer and the other sidewall of the gate. The thickness of the spacers can be adjusted to optimize the performance of the semiconductor device.

18 Claims, 5 Drawing Sheets

FIG. 2I

METHOD FOR MAKING ASYMMETRICAL GATE OXIDE THICKNESS IN CHANNEL MOSFET REGION

FIELD OF THE INVENTION

The present invention relates generally to integrated circuit manufacturing and more particularly to forming insulated gate field effect transistors.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. Currently, the gate oxide is formed having a substantially uniform thickness. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

There is a desire to reduce the dimensions of the IGFET. The impetus for device dimension reduction comes from several interests. One is the desire to increase the number of individual IGFETs that can be placed onto a single silicon chip or die. More IGFETs on a single chip leads to increased functionality. A second desire is to improve performance, and particularly the speed, of the IGFET transistors. Increased speed allows for a greater number of operations to be performed in less time. IGFETs are used in great quantity in computers where the push to obtain higher operation cycle speeds demands faster IGFET performance.

One method to increase the speed of an IGFET is to reduced the length of the conduction channel underneath the gate and dielectric layer regions. However, as IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. Several methods have been used in the past to form a graded doping region. One common technique for use with a typical gate having a gate oxide with a uniform thickness, is the formation of a graded doping in both the source region and the drain region. The most common way to form a graded doping region is to form a lightly doped region in the drain with a first ion implant using the sidewalls of a gate as a self-aligning mask. Spacers are then formed on the sidewalls of the gate and a second implant of dopant is made. In other words, the drain is typically formed by two ion implants. The first light implant is self-aligned to the gate, and a second heavy implant is self-aligned to the gate on which sidewall spacers have been formed. The spacers are typically oxides or nitrides. The part of the drain underneath the spacers is more lightly doped than the portion of the drain not shielded by the spacers. This more lightly doped region is referred to as a lightly doped drain (LDD).

The LDD reduces hot carrier effects by reducing the maximum lateral electric field. The purpose of the lighter first dose is to form a lightly doped region of the drain (or Ldd) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

As shown above, a threshold point exist where heightened speed and reduced dimensions will lead to IGFET breakdown. Conventional approaches have encountered difficulty trying to reconcile the methods for decreasing the hot carrier effects and the methods for improving performance. Also, it is desirable to achieve improved these sought after results without adding costly processing steps. Thus, it is an objective to uncover newly configured IGFET structures and the methods to produce the same which will increase performance increase and while not compromise the IGFET's longevity or fabrication costs.

Graded-drain regions can be created in IGFETs in a number of ways, including: (1) using phosphorus in place of as the dopant of the source/drain regions; (2) adding fast diffusing phosphorus to an As-doped drain region, and driving the phosphorus laterally ahead of the arsenic with a high temperature diffusion step to create a double-diffused drain [DDD] structure; and (3) pulling the highly doped ($n^+$) drain region away from the gate edge with an "oxide spacer" to create a lightly doped drain (LDD) structure. Each of these methods requires a number of processing steps. Most require two implant steps to form a lightly doped region and a heavily doped region. A method is needed which reduces the number of implant processing steps.

SUMMARY OF THE INVENTION

A semiconductor device has gate with a first material having a first dielectric constant adjacent the semiconductor substrate and a second material having a second dielectric constant adjacent the semiconductor substrate. A conductor, such as polysilicon, is then placed on the gate so that the first and second materials are sandwiched between the conductor and the semiconductor substrate. Since the dielectric constants of the two materials are different, the gate acts like a gate having a single dielectric with at least two thicknesses. One dielectric constant is larger than the other dielectric constant. The higher dielectric constant material is comprised of a single spacer located within the gate at the sidewall nearest the drain of the semiconductor device. A layer of silicon dioxide is positioned on the semiconductor substrate between the spacer and the other sidewall of the gate. The thickness of the spacers can be adjusted to optimize the performance of the semiconductor device.

The semiconductor device is formed by making a gate opening in the field oxide. A pair of spacers having a high dielectric constant, in the range of 40–500, are then formed on the sidewalls of the gate opening. One of the spacers is removed leaving a single spacer of high dielectric constant material within the gate at or near the drain of the semiconductor device. A second dielectric material is placed on the semiconductor substrate between the remaining spacer and the other sidewall. Typically gate structure is oxidized which forms $SiO_2$ between the spacer and the other sidewall of the gate. The oxidation process is controlled to grow a desired thickness of silicon dioxide on the gate. Polysilicon or another conductor is then deposited onto the two dielectric materials. The structure is polished and the field oxide removed to complete the gate. Further processing steps are done to complete the semiconductor device.

Advantageously, the dimensions of the dielectric spacer can be varied to optimize the performance of the channel. The thickness of the spacer and the length of the spacer can be changed. The result is a gate having a portion adjacent the channel with different effective oxide layer thicknesses. In other words, the geometry of the gate can be controlled to produce a channel that has a section which is more greatly capacitively coupled to the channel than another portion.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
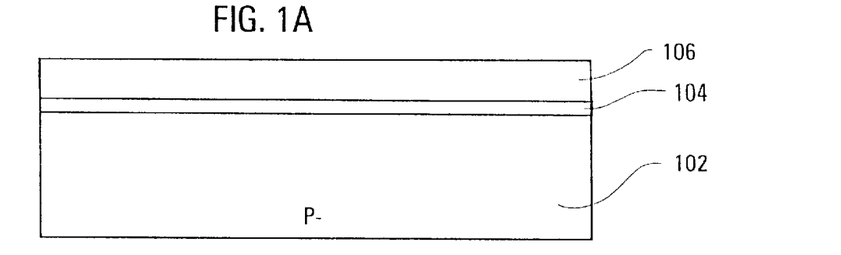
FIGS. 1A–1F show cross-sectional views of successive process steps for making an IGFET having a uniform gate oxide layer and graded doping in the drain region and source region.

An NMOSFET is described to show the most common method for forming a transistor device with a graded source and drain. In FIG. 1A, silicon substrate 102 suitable for integrated circuit manufacture includes P-type epitaxial layer with a boron background concentration on the order of $1\times10^{16}$ atoms/cm$^3$, a <100> orientation and a resistivity of 12 ohm-cm. Preferably, the epitaxial surface layer is disposed on a P+base layer (not shown) and includes a planar top surface. Gate oxide 104, composed of silicon dioxide ($SiO_2$), is formed on the top surface of substrate 102 using oxide tube growth at a temperature of 700° to 1000° C. in an $O_2$ containing ambient. A typical oxidation tube contains several sets of electronically powered heating coils surrounding the tube, which is either quartz, silicon carbide, or silicon. In $O_2$ gas oxidation, the wafers are placed in the tube in a quartz "boat" or "elephant" and the gas flow is directed across the wafer surfaces to the opposite or exhaust end of the tube. A gate oxide 104 having a uniform thickness is formed.

Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 80 kiloelectron-volts. However, it is generally preferred that polysilicon 106 be doped during an implantation step following a subsequent etch step.

Figure 1B:
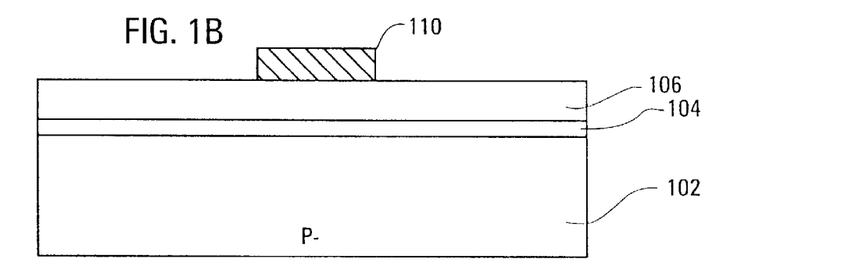

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
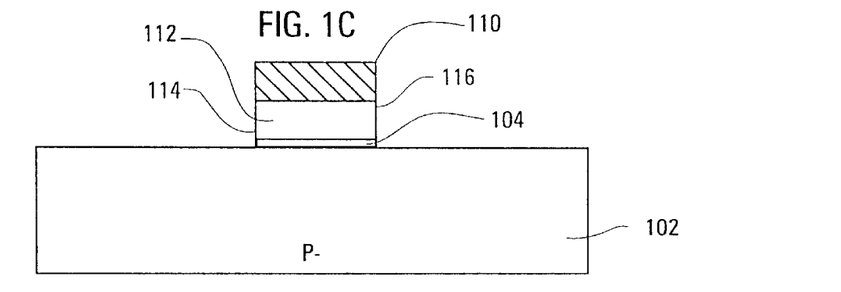

In FIG. 1C, an anisotropic etch is applied that removes the exposed portions of polysilicon 106. Various etchants can be used to anisotropically etch or to selectively remove the polysilicon and oxide layers. Preferably, a first dry or plasma etch is applied that is highly selective of polysilicon. Most of the polysilicon layer 106 is removed, except for the portion beneath the remaining photoresist 110. The gate oxide 104 is left on the surface of the silicon substrate 102 and has a thickness in the range of 30–60 angstroms. Typically, the gate oxide 104 is placed on the surface of the silicon substrate 102 at the selected thickness in the range of 30–60 angstroms. Although unlikely, a second dry or plasma etch may be applied that is highly selective of silicon dioxide (the typical gate material), using the remaining photoresist 110 as an etch mask to thin the layer of the gate oxide 104 to a selected thickness. After the etching step or steps, a gate oxide layer of 30–60 angstroms remains atop the surface of the silicon substrate, and the remaining portion of the polysilicon 106 provides polysilicon gate 112 with opposing vertical sidewalls 114 and 116. Polysilicon gate 112 has a length (between sidewalls 114 and 116) of 3500 angstroms.

Figure 1D:
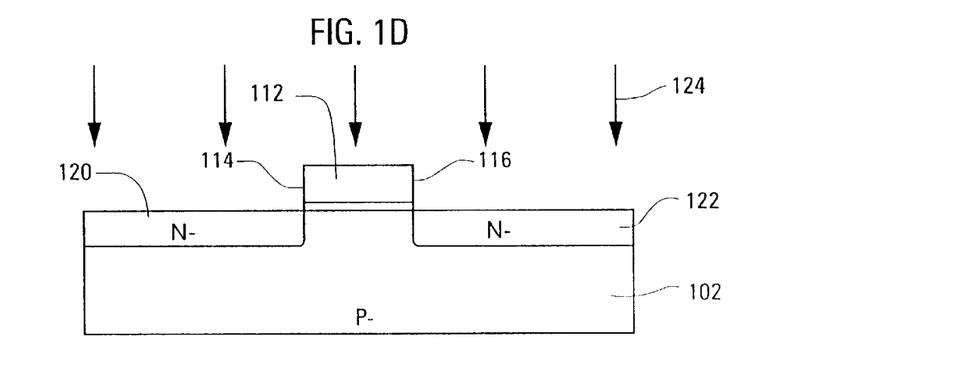

In FIG. 1D, photoresist 110 is stripped, and lightly doped source and drain regions 120 and 122 are implanted into substrate 102 by subjecting the structure to ion implantation of phosphorus, indicated by arrows 124, at a dose in the range of $1\times10^{13}$ to $5\times10^{14}$ atoms/cm$^2$ and an energy in the range of 2 to 35 kiloelectron-volts. The ion implantation of phosphorus is done through the layer of gate oxide 104.

Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped N—with a phosphorus concentration in the range of about $1\times10^{17}$ to $5\times10^{18}$ atoms/cm$^3$.

Figure 1E:
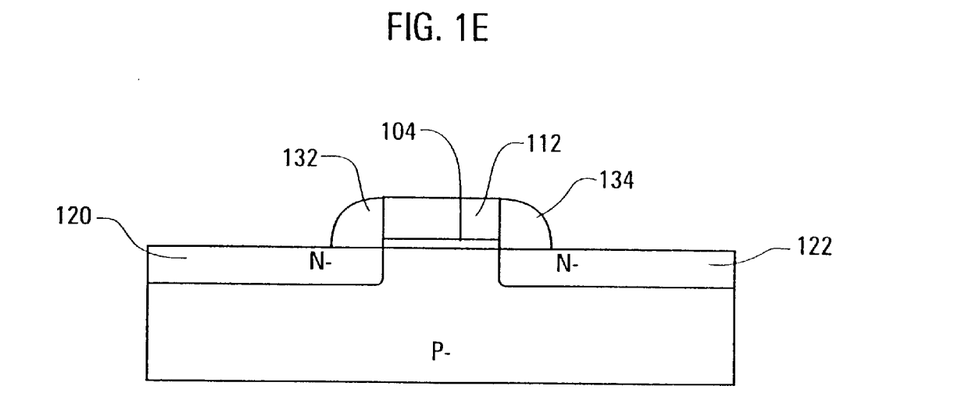

As shown in FIG. 1E, spacers 132 and 134 are formed. A blanket layer of silicon dioxide with a thickness of approximately 2500 angstroms is conformably deposited over the exposed surfaces by CVD at a temperature in the range of 300° to 400° C. Thereafter, the structure is subjected to an anisotropic etch, such as a reactive ion etch, that is highly selective of silicon dioxide to form oxide spacers 132 and 134 adjacent to sidewalls 114 and 116, respectively. Oxide spacers 132 and 134 each extend approximately 1200 angstroms across substrate 102.

Figure 1F:
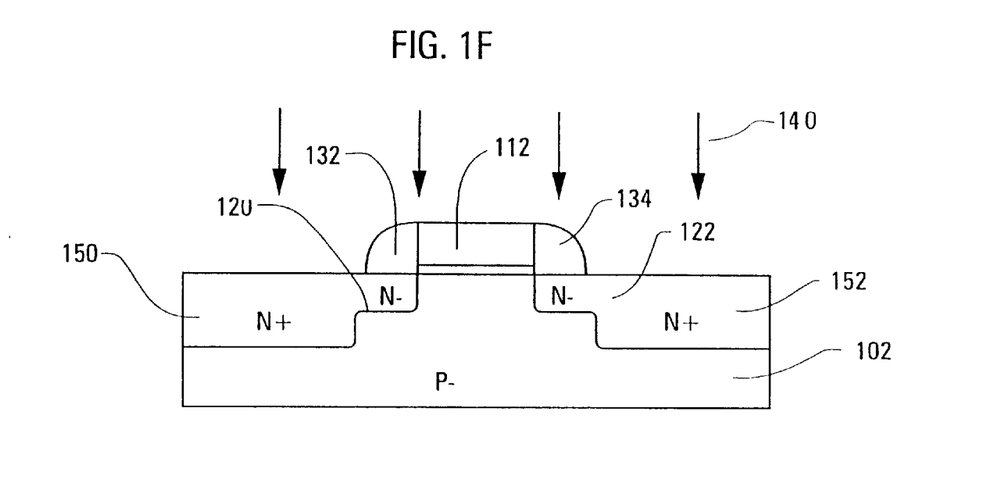

In FIG. 1F, the portions of the lightly doped source region 120 and the lightly doped drain region 122 outside oxide spacers 132 and 134 are converted into heavily doped source region 150 and heavily doped drain region 152 by subjecting the structure to ion implantation of arsenic, indicated by arrows 140, at a dose in the range of $2\times10^{15}$ to $3\times10^5$ atoms/cm$^2$ and an energy in the range of 20 to 80 kiloelectron-volts. Polysilicon gate 112 and oxide spacers 132 and 134 provide an implant mask for the underlying portion of substrate 102. As a result, the heavily doped source region 150 and heavily doped drain region 152 are substantially aligned with the oxide spacer 132 on the side opposite sidewall 114, and the oxide spacer 134 on the side opposite sidewall 116. A rapid thermal anneal on the order of 900° to 1050° C. for 10 to 30 seconds is applied to remove crystalline damage and to drive-in and activate the implanted dopants. As a result, heavily doped source region 150 and the lightly doped source region 120 merge to form a source with graded doping. Similarly, heavily doped source region 152 and the lightly doped source region 122 merge to form a drain with graded doping.

Figure 2A:
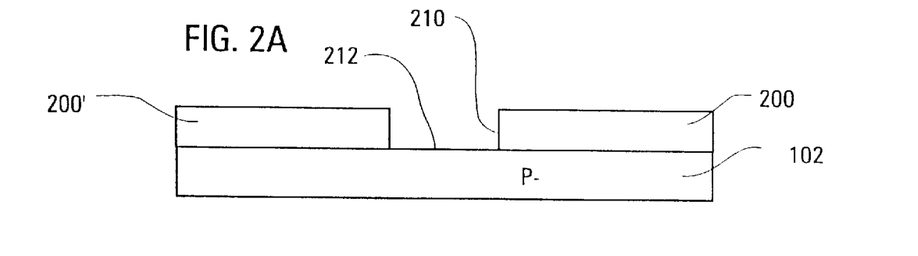
FIGS. 2A–2I show cross-sectional views of successive process steps for making an IGFET with a gate oxide having several thicknesses in accordance with an embodiment of the invention.

As shown in FIG. 2A, a substrate 102 has a field oxide layer 200 deposited upon the substrate. Deposited on the field oxide layer 200 is a photoresist (not shown). The photoresist is masked, exposed and then removed. An etchant is placed in the removed area to etch away a portion of the field oxide layer and form a gate opening 210 within the field oxide layer 200. The remaining photoresist is either stripped or removed such that there is a first portion of field oxide layer 200 and a second portion of field oxide layer 200'. The area between the field oxide layers 200 and a second portion of field oxide layer 200'. The area between the field oxide layers 200 and 200' at the exposed substrate 102 is the gate area 212.

Figure 2B:
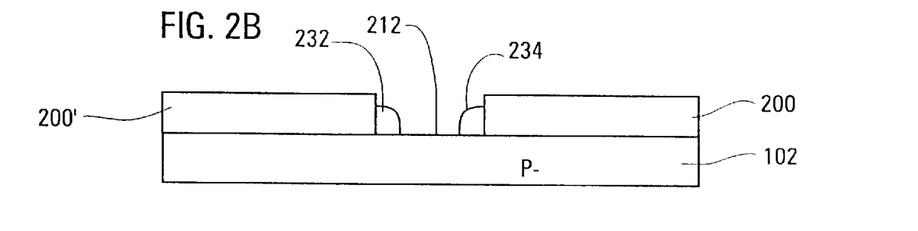

As shown in FIG. 2B, the next step is to deposit a high K material over the gate area 212 and then to form spacers from the deposited high K value material. A first high K material spacer 232 is formed on one end of the gate area 212 and a second high K material spacer 234 is formed on the other end of the gate area 212. Spacer 232 abuts the field oxide layer 200'. Spacer 234 abuts field oxide layer 200. The high K spacers 232 and 234 are formed of a material having a high dielectric constant. The dielectric constant K is best explained in terms of an equation for determining the capacitance. The capacitance in picofarads can be calculated with the following formula:

$$\text{Capacitance} = \frac{0.0885 \times K \times A}{T}$$

A represents the area of the side of one of the plates that is actually in physical contact with the dielectric. This area is measured in square centimeters for this equation. T represents the thickness of the dielectric (or the space between the plates), and is also measured in centimeters. K, of course, is the dielectric constant.

The dielectric constant of air has a value of 1, while the dielectric constant of SiO$_2$ has a value of 4, and the dielectric constant of nitride has a value of 8. The dielectric constant of TiO$_2$ has a value as high as 170. Typically, the dielectric constant or K value of the materials used to form the spacers 232 and 234 is in the range of 40–500. Gate oxide is typically SiO$_2$ and therefor the thickness of a high K material is many times equated to an effective SiO$_2$ thickness. For a given material, the effective SiO$_2$ thickness equals the K value or dielectric constant of the material divided by 4 (which is the dielectric constant of SiO$_2$) multiplied by the thickness of the material.

Since the material of the spacers 232 and 234 has a dielectric constant or K value that is in the 40–500 range, the effective gate oxide thickness may be smaller or larger than the gate oxide thickness. In other words, the thickness of the spacers and the K value associated therewith can be varied to produce an effective oxide layer on the gate which has differing effective SiO$_2$ thickness.

Figure 2C:
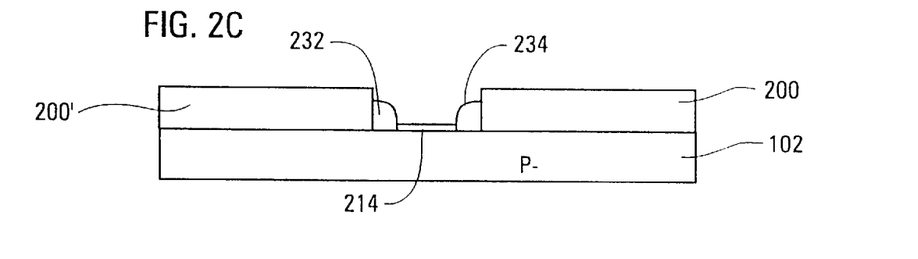

As shown in FIG. 2C, an oxide layer 214 is grown on the gate area 212 between the first high K material spacer 232 formed on one end of the gate area 212 and a second high K material spacer 234 formed on the other end of the gate area 212. Oxide layer 214, composed of silicon dioxide (SiO$_2$), is formed on the top surface of substrate 102 using oxide tube growth at a temperature of 700° to 1000° C. in an O$_2$ containing ambient. A typical oxidation tube contains several sets of electronically powered heating coils surrounding the tube, which is either quartz, silicon carbide, or silicon. In O$_2$ gas oxidation, the wafers are placed in the tube in a quartz "boat" or "elephant" and the gas flow is directed across the wafer surfaces to the opposite or exhaust end of the tube. The oxide layer can also be formed using rapid thermal annealing (RTA). RTA has several advantages over the use of an oxide tube, including less warpage of the wafers and localized heating. Depending on the type of high K material used, an oxide layer may also form on the spacer 232 or the spacer 234. As shown in FIG. 2C, no oxide layer was formed.

Figure 2D:
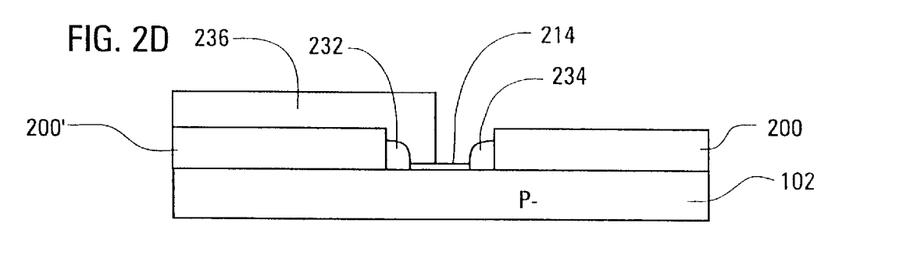

Now turning to FIG. 2D, a channel mask 236 is placed over the spacer 232. The spacer 234 is removed using a dry or wet etch process.

Figure 2E:
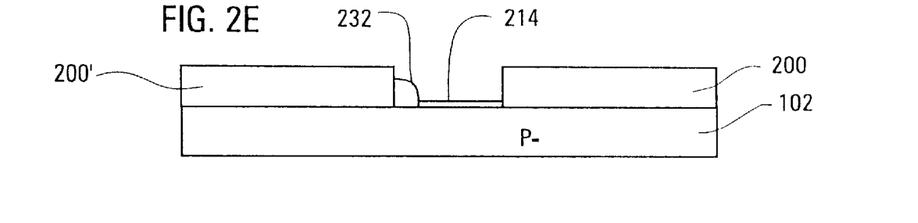

In FIG. 2E, the channel mask 236 is removed leaving one spacer 232. Additional oxide is deposited onto the surface near the eventual channel of the semiconductor device to be formed. The oxide layer 214 is slightly thicker in FIG. 2E when compared to the oxide layer shown in FIG. 2D.

Figure 2F:
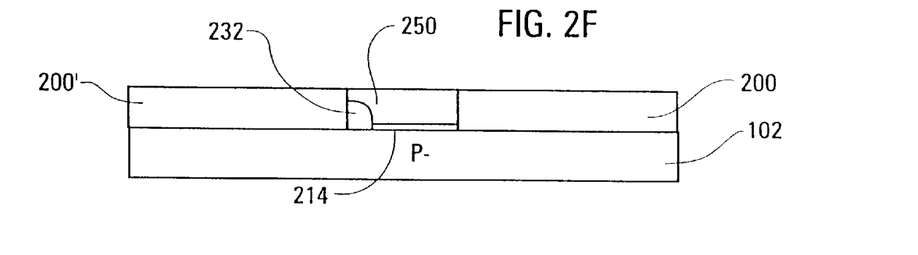

Now turning to FIG. 2F, polysilicon or another conductor 250 is deposited between the field oxide layer 200' and the field oxide layer 200, atop the oxide layer 214 and atop the remaining spacer 232 made from a high K material and the field oxide 200. After the polysilicon or other conductor 250 is deposited, the top surface of the polysilicon or other conductor 250 and the oxide layers 200' and 200 are polished to form a smooth surface.

Figure 2G:
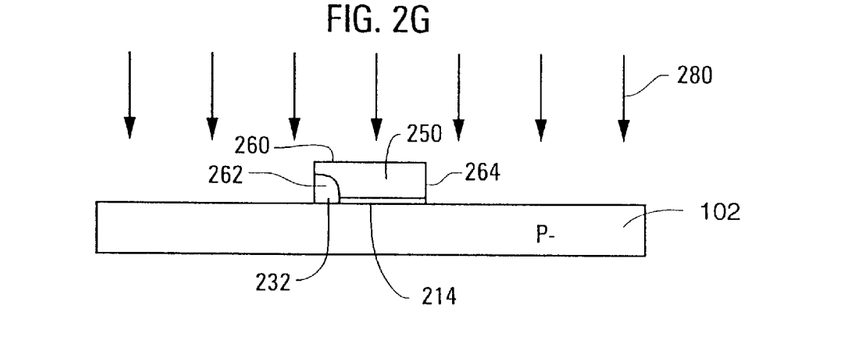

Now turning to FIG. 2G, the oxide layers 200 and 200' are removed using an oxide etch. The oxide etch is very selective to the oxide layers 200 and 200' and can be either a dry or a wet etch. The resulting structure is a gate 260 having sidewalls 262 and 264. The gate 260 has gate oxide layer that includes a single high K material spacer 232 and a layer of SiO$_2$ between the spacer and the sidewall 264. In other words, looking at the surface of the substrate the portion of the gate 260 adjacent the substrate 102 there is included a high K material spacer 232, and a layer of SiO$_2$ 214. The next step is to implant arsenic ions to form a source and drain 274 and 272 (shown in FIG. 2F). The arsenic ion implantation, indicated by arrows 280, is at a dose in the range of $2\times10^{15}$ to $6\times10^{15}$ atoms/cm$^2$ and at an energy in the range of 20–80 kiloelectron-volts. The space 232 of high K material is generally placed closest to the drain 272.

Figure 2H:
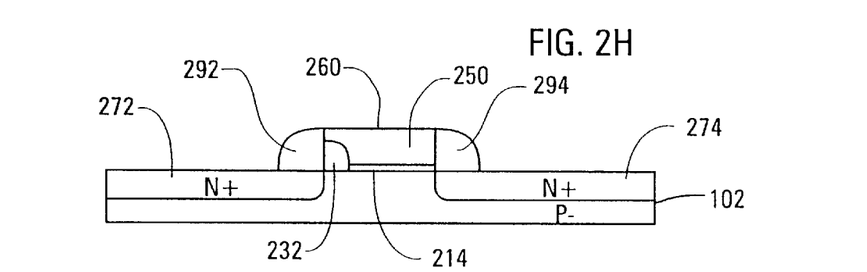

As shown in FIG. 2H, the spacers 292 and 294 are added to the sidewalls 262 and 264. The spacers 292 and 294 are positioned over a portion of the drain 272 and the source 274. As shown in FIG. 2G, the structure is then subjected to a heat treatment such as an annealing process. The end result is that some of the arsenic in the source 272 and drain 274 migrates into some of the silicon substrate 102 underneath the oxide layer 204. The forms a lightly doped region near the gate oxide 204, proximate each end of the gate oxide. Although only one implant step is shown another implant step may be done to form a heavily doped region. Although an NMOSFET has been described above, a similar technique could be used to form a PMOSFET.

The channel width can be accurately controlled by controlling the width of the spacer 232. The channel can also be controlled by controlling the thickness of the oxide layer 214 as well as by selecting a material having a desired dielectric constant or a high K material for the spacer 232. Since the material of the spacer 232 has a dielectric constant or K value that is in the 40–500 range, the effective gate oxide thickness may be smaller or larger than the gate oxide 214 thickness. In other words, the thickness of the spacers and the K value associated therewith can be varied to produce an effective oxide layer on the gate 260 which has differing effective SiO$_2$ thickness as it spans the gate 260. The insulative layer adjacent the gate area 212 or adjacent the channel is also comprised of more than one material, namely an SiO$_2$ and a selected material having a high K value. The SiO$_2$ layer is bounded by a single spacer 232 formed of a material having a high dielectric constant or K value and by a sidewall 264. The composition and shape of the high K value spacer 232 can be adjusted to optimize performance of the transistor formed. Advantageously, the dimensions of the dielectric spacer 232 can be varied to optimize the performance of the channel. The thickness of the spacer and the length of the spacer can be changed. The result is a gate having a portion adjacent the channel with different effective oxide layer thicknesses. In other words, the geometry of the gate can be controlled to produce a channel that has a section which is more greatly capacitively coupled to the channel than another portion.

Further processing steps in the fabrication of IGFETs typically include forming salicide contacts on the gate, source and drain, forming a thick oxide layer over the active region, forming contact windows in the oxide layer to expose the salicide conforming interconnect metallization in the contact windows, and forming a passivation layer over the interconnect metallization. Salicidation includes the formation of spacers on the gate, depositing a metal layer over the entire resulting surface and reacting the metal to form a salicide on top of the gate 260, on the top of the source 274 and on the top of the drain 272. Unreacted metal is then removed, glass is placed over the surface and a contact opening is formed for connectors. A passivation layer may also then deposited as a top surface. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate insulator and spacers and can be various dielectrics including silicon dioxide, silicon nitride and silicon oxynitride. Suitable N-type dopants include arsenic, phosphorus and combinations thereof. Alternatively, if a P-channel device is desired, suitable P-type dopants include boron, boron species (such as boron difluoride) and combinations thereof.

Figure 2I:
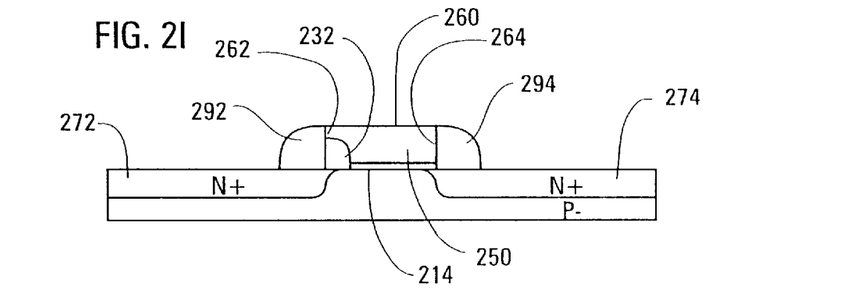
Figure 3:
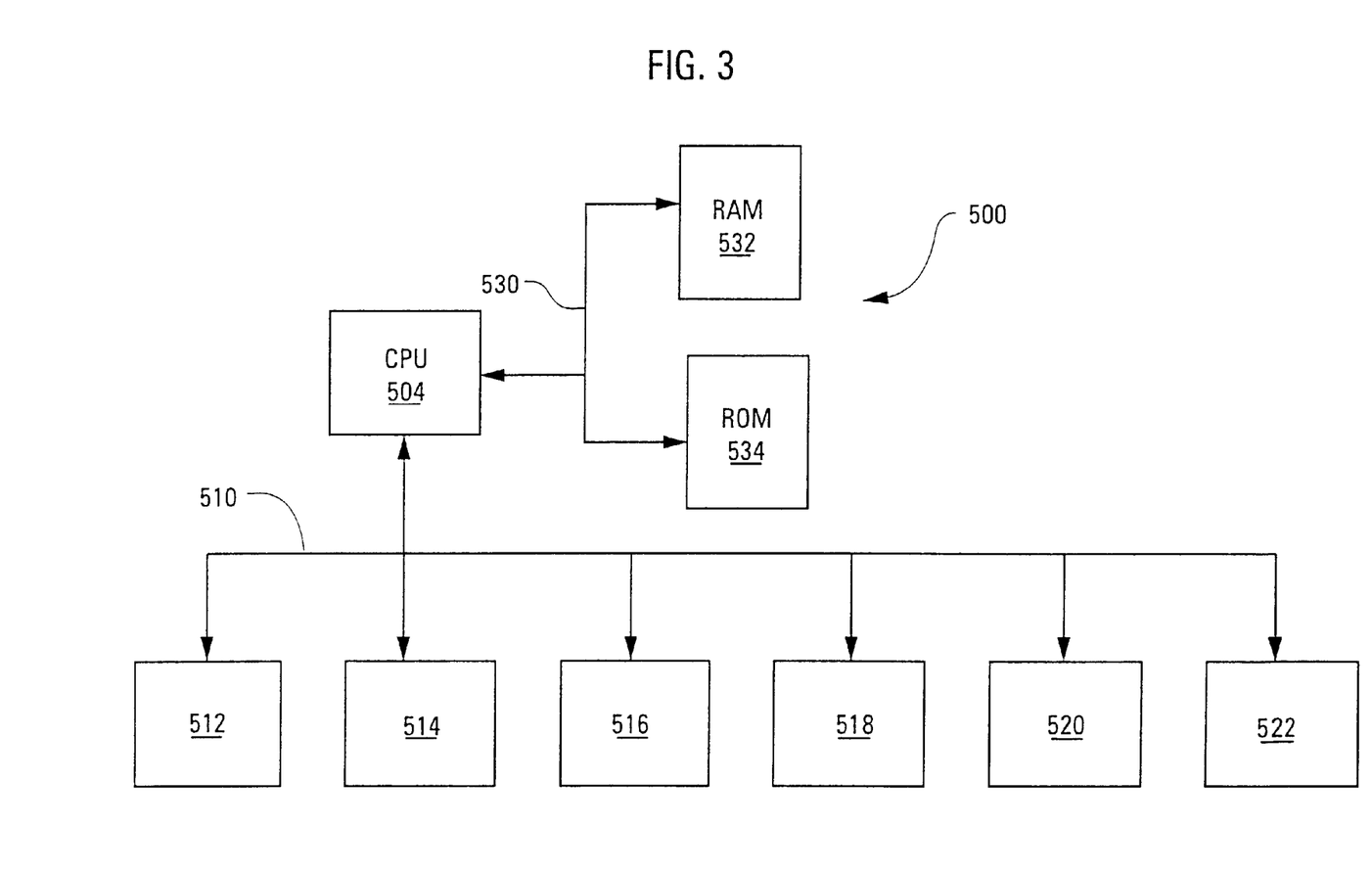
FIG. 3 is a schematic of an information handling system.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system 500 includes a central processing unit 504, a random access memory 532, and a system bus 530 for communicatively coupling the central processing unit 504 and the random access memory 532. The information handling system 500 includes a device formed by the steps shown in FIGS. 2A–2I, as described above. The system 500 may also include an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals. The information handling system 500 includes a device such as is shown in FIG. 2I. The channel formed as in the steps shown in FIGS. 2A–2I and the resulting device provides for a fast and reliable channel having a long life. Faster channels are needed as clocking speeds for microprocessors climb and the channel must also be reliable and long-lived. The drain regions can be formed in one ion implant step rather than several. The length of the channel is also controllable since the spacer an also be controlled.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a device comprising the steps of:
    forming a first gate portion adjacent the channel from a material having a first dielectric constant near one sidewall of the gate; and
    forming a second gate portion adjacent the channel from a second material having a second dielectric constant.

2. The method of claim 1 wherein the first dielectric constant of the material of the first gate portion is greater than the second dielectric constant of the second gate portion.

3. The method of claim 1 further comprising the step adding a conductive portion to the gate.

4. The method of claim 3 wherein the step of adding a conductive portion to the gate includes depositing polysilicon on the first and second gate materials.

5. The method of claim 1 wherein the step of forming a first gate material on the gate area includes forming a first portion of a material having a dielectric constant in the range of 40–500.

6. The method of claim 5 wherein the step of forming a second gate material on the gate area includes exposing the channel area of the substrate to oxygen.

7. The method of claim 5 wherein the step of forming a first gate material on the gate area includes forming a first spacer at the sidewall of the gate nearest the drain of the semiconductor device.

8. The method of claim 7 further comprising the step of implanting the silicon substrate with ions to form a source and drain.

9. The method of claim 7 further comprising the step of varying the thickness of the spacer.

10. The method of claim 9 further comprising the step growing an oxide layer adjacent the channel of the semiconductor device, said oxide layer between the spacer and the sidewall nearest the source of the semiconductor.

11. The method of claim 4 wherein the step of forming a second gate material on the gate erea includes exposing the channel area of the substrate to oxygen.

12. The method of claim 11 wherein the step of forming a first gate material on the gate area includes forming a first spacer at the sidewall of the gate nearest the drain of the semiconductor device.

13. The method of claim 6 wherein the step of forming a first gate material on the gate area includes forming a first spacer at the sidewall of the gate nearest the drain of the semiconductor device.

14. The method of claim 13 further comprising the step of implanting the silicon substrate with ions to form a source and drain.

15. The method of claim 12 further comprising the step of implanting the silicon substrate with ions to form a source and drain.

16. The method of claim 12 further comprising the step growing an oxide layer adjacent the channel of the semiconductor device, said oxide layer between the spacer and the sidewall nearest the source of the semiconductor.

17. The method of claim 15 further comprising the step growing an oxide layer adjacent the channel of the semiconductor device, said oxide layer between the spacer and the sidewall nearest the source of the semiconductor.

18. The method of claim 11 further comprising the step growing an oxide layer adjacent the channel of the semiconductor device, said oxide layer between the spacer and the sidewall nearest the source of the semiconductor.

\* \* \* \* \*

UNITED STATES PATENT AND TRADEMARK OFFICE
CERTIFICATE OF CORRECTION

PATENT NO. : 6,127,235
DATED : October 3, 2000
INVENTOR(S) : Gardner et al.

It is certified that error appears in the above-identified patent and that said Letters Patent is hereby corrected as shown below:

Column 1,
Line 56, "reduced" should read -- reduce --.

Column 5,
Line 25, "$3 \times 10^5$" should read -- $3 \times 10^{15}$ --.

Column 8,
Line 39, "an" should read -- can --.

Column 9,
Line 18, "erea" should read -- area --.

Signed and Sealed this

Thirtieth Day of April, 2002

*Attest:*

*Attesting Officer*

JAMES E. ROGAN
*Director of the United States Patent and Trademark Office*